United States Patent
Koo

(10) Patent No.: US 7,875,526 B2
(45) Date of Patent: Jan. 25, 2011

(54) SEMICONDUCTOR DEVICE WITH CONTACT STABILIZATION BETWEEN CONTACT PLUGS AND BIT LINES AND METHOD FOR MANUFACTURING THE SAME

(75) Inventor: Dong Chul Koo, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/782,903

(22) Filed: May 19, 2010

(65) Prior Publication Data
US 2010/0227448 A1    Sep. 9, 2010

Related U.S. Application Data

(62) Division of application No. 11/953,313, filed on Dec. 10, 2007, now Pat. No. 7,745,864.

(30) Foreign Application Priority Data
Oct. 9, 2007    (KR) .................. 10-2007-0101423

(51) Int. Cl.
H01L 21/20    (2006.01)

(52) U.S. Cl. .............. 438/397; 438/171; 438/190; 438/210; 438/238; 438/239; 438/244; 438/329; 438/396

(58) Field of Classification Search .............. 438/171, 438/190, 210, 238, 239, 244, 329, 396, 397
See application file for complete search history.

(56) References Cited

U.S. PATENT DOCUMENTS
2002/0135004 A1*  9/2002  Uh et al. .................. 257/296
* cited by examiner

*Primary Examiner*—Tan N Tran
(74) *Attorney, Agent, or Firm*—Ladas & Parry LLP

(57) ABSTRACT

A semiconductor device includes a semiconductor substrate divided into a cell array region, a core region, and a peripheral region. Bit lines are formed in the respective regions. Storage node contact plugs are formed in the cell array region, and blocking patterns are simultaneously formed around the bit lines of the core region and the peripheral region. Capacitors are formed in the cell array region to come into contact with the storage node contact plugs, and metal contact plugs are formed to come into contact with the capacitors of the cell array region and the bit lines of the core region and the peripheral region. In the semiconductor device, even if the metal contact plugs are not aligned with the bit lines, the blocking pattern works to stabilize the contact between the metal contact plugs and the bit lines.

6 Claims, 6 Drawing Sheets

US 7,875,526 B2

SEMICONDUCTOR DEVICE WITH CONTACT STABILIZATION BETWEEN CONTACT PLUGS AND BIT LINES AND METHOD FOR MANUFACTURING THE SAME

CROSS-REFERENCE TO RELATED APPLICATIONS

The present application claims priority to Korean patent application number 10-2007-0101423 filed on Oct. 9, 2007, which is incorporated herein by reference in its entirety.

BACKGROUND OF THE INVENTION

The present invention relates to a semiconductor device and a method for manufacturing the same, and more particularly, to a semiconductor device that accomplishes contact stabilization between contact plugs and bit lines and a method for manufacturing the same.

As the design rules of semiconductor devices decrease, the height of capacitors in the semiconductor devices gradually increase in order to sufficiently secure the capacitance of a DRAM (dynamic random access memory).

In a DRAM having a COB (capacitor-over-bit line) structure, as the height of a capacitor gradually increases, the aspect ratio of metal contact plugs, which are formed on bit lines in the core region and the peripheral region of a semiconductor substrate, increases. The increase in the aspect ratio of the metal contact plugs decreases the overlap margin between the metal contact plugs and the bit lines. As a consequence, the metal contact plugs and the bit lines in the core region and the peripheral region of the semiconductor device are likely to be misaligned.

FIG. 1 is a cross-sectional view showing the misalignment between a metal contact plug 162 and a bit line 132 when the metal contact plug 162 is formed in a core region or a peripheral region according to the conventional art.

The reference numeral 100 designates a semiconductor substrate, 110 a gate, 111 a junction area, 113 spacers, and 172 a metal line.

Due to the high integration of a semiconductor device, the misalignment between the bit line 132 and the metal contact plug 162 can cause a short circuit between the gate 110 and the junction area 111, and thereby, the operation characteristics of the semiconductor device are deteriorated.

For example, the high integration of the semiconductor device decreases the overlap margin between the metal contact plug 162 and the bit line 132 in the core region and the peripheral region. The decreased overlap margin may result in the misalignment between the bit line 132 and the metal contact plug 162. As a consequence, an undesirable short circuit can be formed which results in the deterioration of the operation characteristics of the semiconductor device.

SUMMARY OF THE INVENTION

Embodiments of the present invention are directed to a semiconductor device that can prevent deterioration in the operation characteristics of the semiconductor device caused by the misalignment of metal contact plugs, and a method for manufacturing the same.

In one aspect, a semiconductor device comprises: a semiconductor substrate divided into a cell array region, a core region, and a peripheral region; bit lines formed over the substrate in the respective regions; storage node contact plugs formed in the cell array region; blocking patterns formed simultaneously with the storage node contact plugs, the blocking patterns being formed around the bit lines in the core region and the peripheral region; capacitors formed in the cell array region to come into contact with the storage node contact plugs; and metal contact plugs formed to come into contact with the capacitors of the cell array region and the bit lines of the core region and the peripheral region.

The storage node contact plugs, which are formed simultaneously with the blocking patterns, may have a single-layered structure.

Alternatively, the storage node contact plugs, which are formed simultaneously with the blocking patterns, may have a stacked structure including a lower pattern and an upper pattern.

When the storage node contact plugs are formed in the stacked structure, the blocking patterns are formed in the same layer as the upper patterns of the storage node contact plugs.

The blocking patterns may have the sectional shape of a ring, a picture frame, a bar, or a 'U' rotated clockwise by 90°.

The blocking patterns have a width of 0.001~0.5 µm.

In another aspect of the present invention, a method for manufacturing a semiconductor device comprises the steps of: forming bit lines in a cell array region, a core region, and a peripheral region of a semiconductor substrate; forming storage node contact plugs in the cell array region and blocking patterns around the bit lines of the core region and the peripheral region; forming capacitors in the cell array region to come into contact with the storage node contact plugs; and forming metal contact plugs to come into contact with the capacitors of the cell array region and the bit lines of the core region and the peripheral region.

The storage node contact plugs are formed simultaneously with the blocking patterns, and the blocking patterns may be formed in a single-layered structure.

Alternatively, the storage node contact plugs formed simultaneously with the blocking patterns may have a stacked structure including a lower pattern and an upper pattern.

When the storage node contact plugs are formed in the stacked structure, the blocking patterns are formed simultaneously with the upper patterns of the storage node contact plugs.

The blocking patterns are formed to have the sectional shape of a ring, a picture frame, a bar or a 'U' rotated clockwise by 90°.

The blocking patterns are formed to have a width of 0.001~0.5 µm.

In still another aspect, a method for manufacturing a semiconductor device comprises the steps of forming bit lines in a cell array region, a core region and a peripheral region of a semiconductor substrate; forming a first interlayer dielectric over the semiconductor substrate including the bit lines; forming storage node contact plugs in the first interlayer dielectric of the cell array region, and forming blocking patterns in the first interlayer dielectric around the bit lines of the core region and the peripheral region; forming a mold insulation layer on the first interlayer dielectric including the storage node contact plugs and the blocking patterns; forming capacitors in the mold insulation layer of the cell array region to come into contact with the storage node contact plugs; forming a second interlayer dielectric on the mold insulation layer including the capacitors; etching the second interlayer dielectric, the mold insulation layer, and the first interlayer dielectric to define contact holes exposing tie capacitors of the cell array region and the bit lines of the core region and the peripheral region; and forming metal contact plugs in the contact holes of the respective regions.

The blocking patterns are formed to have the sectional shape of a ring, a picture frame, a bar or a 'U' rotated clockwise by 90°.

The blocking patterns are formed to have a width of 0.001~0.5 µm.

In a further aspect, a method for manufacturing a semiconductor device comprises the steps of forming bit lines in a cell array region, a core region and a peripheral region of a semiconductor substrate; forming a first interlayer dielectric over the semiconductor substrate including the bit lines; forming first storage node contact plugs in the first interlayer dielectric of the cell array region; forming an insulation layer on the first interlayer dielectric including the first storage node contact plugs; forming second storage node contact plugs in the insulation layer to come into contact with the first storage node contact plugs and forming blocking patterns in an area of the insulation layer corresponding to an area around the bit lines of the core region and the peripheral region; forming a mold insulation layer on the insulation layer including the second storage node contact plugs and the blocking patterns; forming capacitors in the mold insulation layer of the cell array region to come into contact with the second storage node contact plugs; forming a second interlayer dielectric on the mold insulation layer including the capacitors; etching the second interlayer dielectric, the mold insulation layer, the insulation layer, and the first interlayer dielectric to define contact holes exposing the capacitors of the cell array region and the bit lines of the core region and the peripheral region; and forming metal contact plugs in the contact holes of the respective regions.

The blocking patterns are formed to have the sectional shape of a ring, a picture frame, a bar or a 'U' rotated clockwise by 90°.

The blocking patterns are formed to have a width of 0.001~0.5 μm.

DESCRIPTION OF SPECIFIC EMBODIMENTS

In the present invention, when forming storage node contact plugs in the cell array region of a semiconductor substrate, blocking patterns are formed around bit lines that are formed in the core region and the peripheral region of the semiconductor substrate.

As such, when forming metal contact plugs for connecting the bit lines with the metal lines in the core region and the peripheral region of the semiconductor substrate, even if a misalignment occurs due to a decrease in the overlap margin between the bit lines and the metal contact plugs, contact stabilization can be accomplished between the metal contact plugs and the bit lines due to the presence of the blocking patterns.

Hereafter, specific embodiments of the present invention will be described in detail with reference to the attached drawings.

FIGS. 2A through 2D are cross-sectional views illustrating the processes of a method for manufacturing a semiconductor device in accordance with an embodiment of the present invention.

Figure 1:
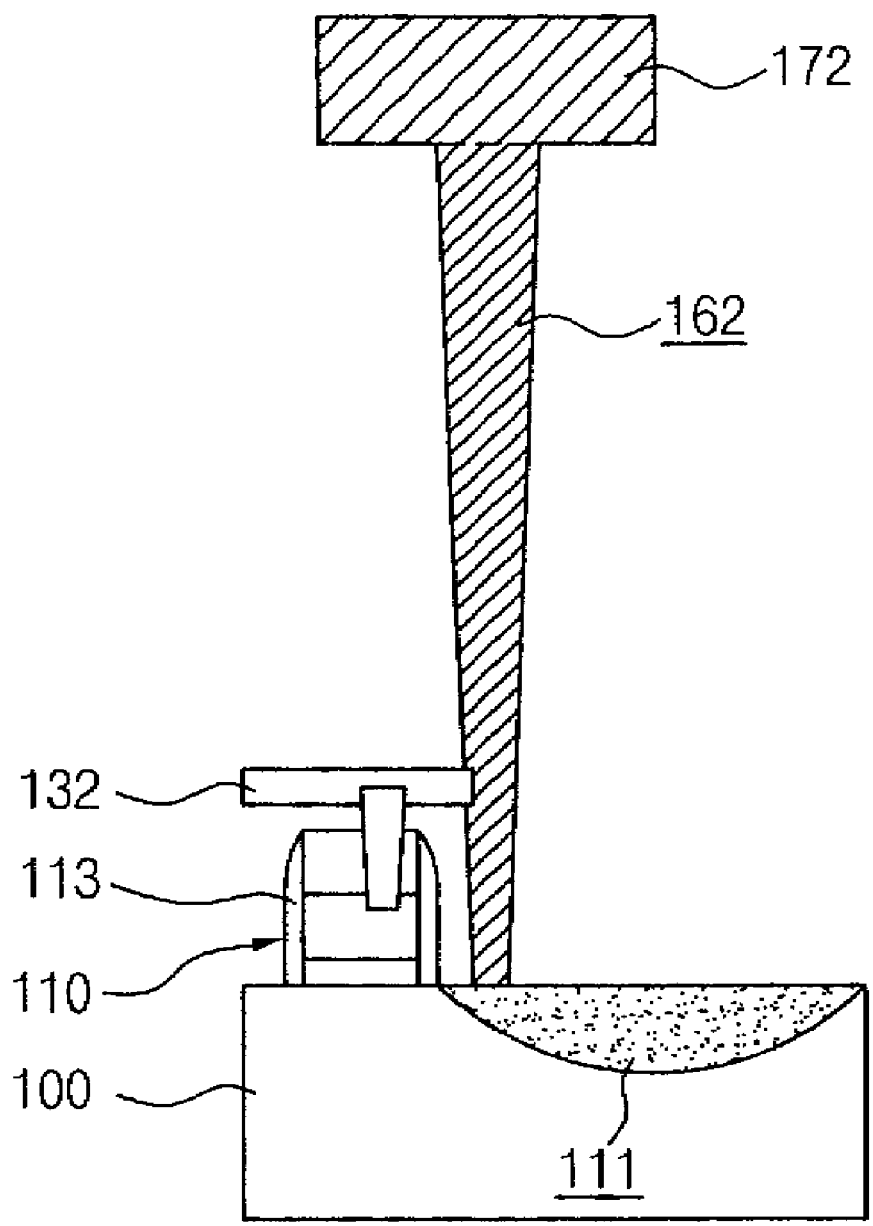
FIG. 1 is a cross-sectional view showing a metal contact plug formed in the core region and the peripheral region of a conventional semiconductor substrate.
Figure 2A:
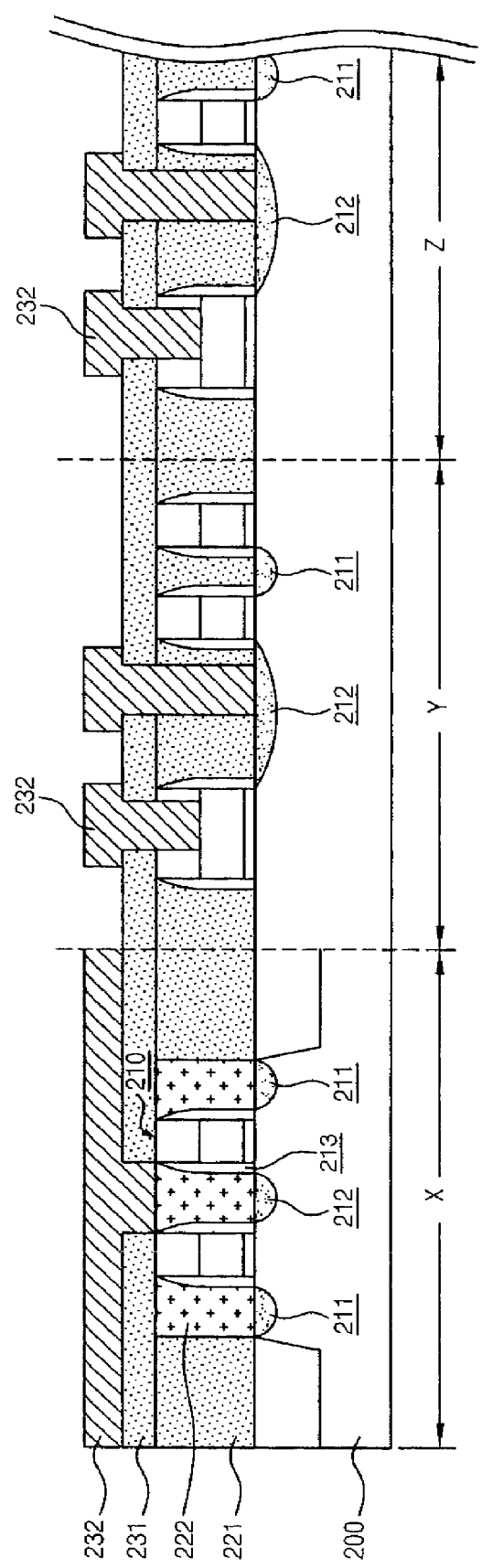
FIGS. 2A through 2D are cross-sectional views illustrating the processes of a method for manufacturing a semiconductor device in accordance with an embodiment of the present invention.

Referring to FIG. 2A, transistors, each including a gate 210 and source and drain areas 211 and 212, are formed in the cell array region X, the core region Y, and the peripheral region Z of a semiconductor substrate 200. Landing plug contacts 222 are formed in the cell array region X to come into contact with the source and drain areas 211 and 212. Bit lines 232 are then formed to come into contact with the landing plug contact 222 that is in contact with the drain area 212 in the cell array region X and the gates 210 and the drain area 212 formed in the core region Y and the peripheral region Z. The reference numeral 213 designates spacers, and 221 and 231 designate insulation layers.

Figure 2B:
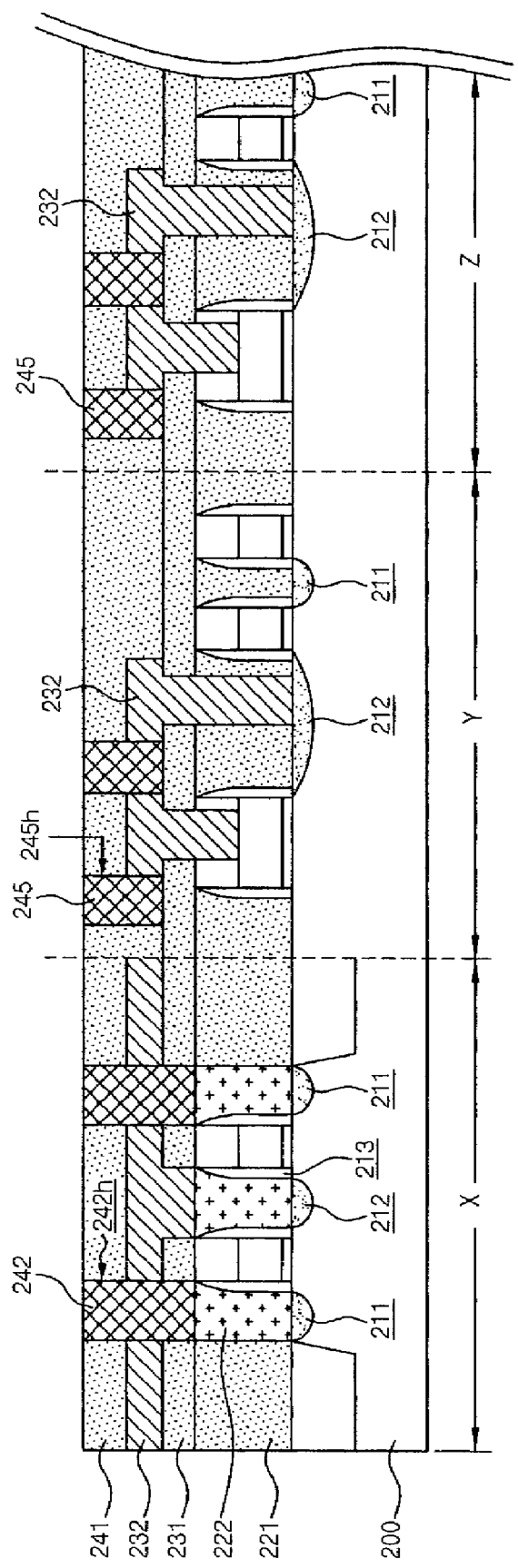

Referring to FIG. 2B, a first interlayer dielectric 241 is formed over the semiconductor substrate 200 having the bit lines 232 in the respective regions thereof. The first interlayer dielectric 241 is etched to form contact holes 242h for storage nodes. The contact holes 242h are defined to expose the landing plug contacts 222 formed in the source areas 211 of the cell array region X. Grooves 245h for blocking patterns are defined around the bit lines 232 in the core region Y and the peripheral region Z. A conductive layer is deposited on the first interlayer dielectric 241 to fill the contact holes 242h for storage nodes and the grooves 245h for blocking patterns.

The conductive layer is chemically and mechanically polished (CMPed) to form both storage node contact plugs 242 in the contact holes 242h for storage nodes in the cell array region X and blocking patterns 245 in the grooves 245h for blocking patterns in the core region Y and the peripheral region Z. The blocking patterns 245 are formed to have a width in the range of 0.001~0.5 μm.

Figure 2C:
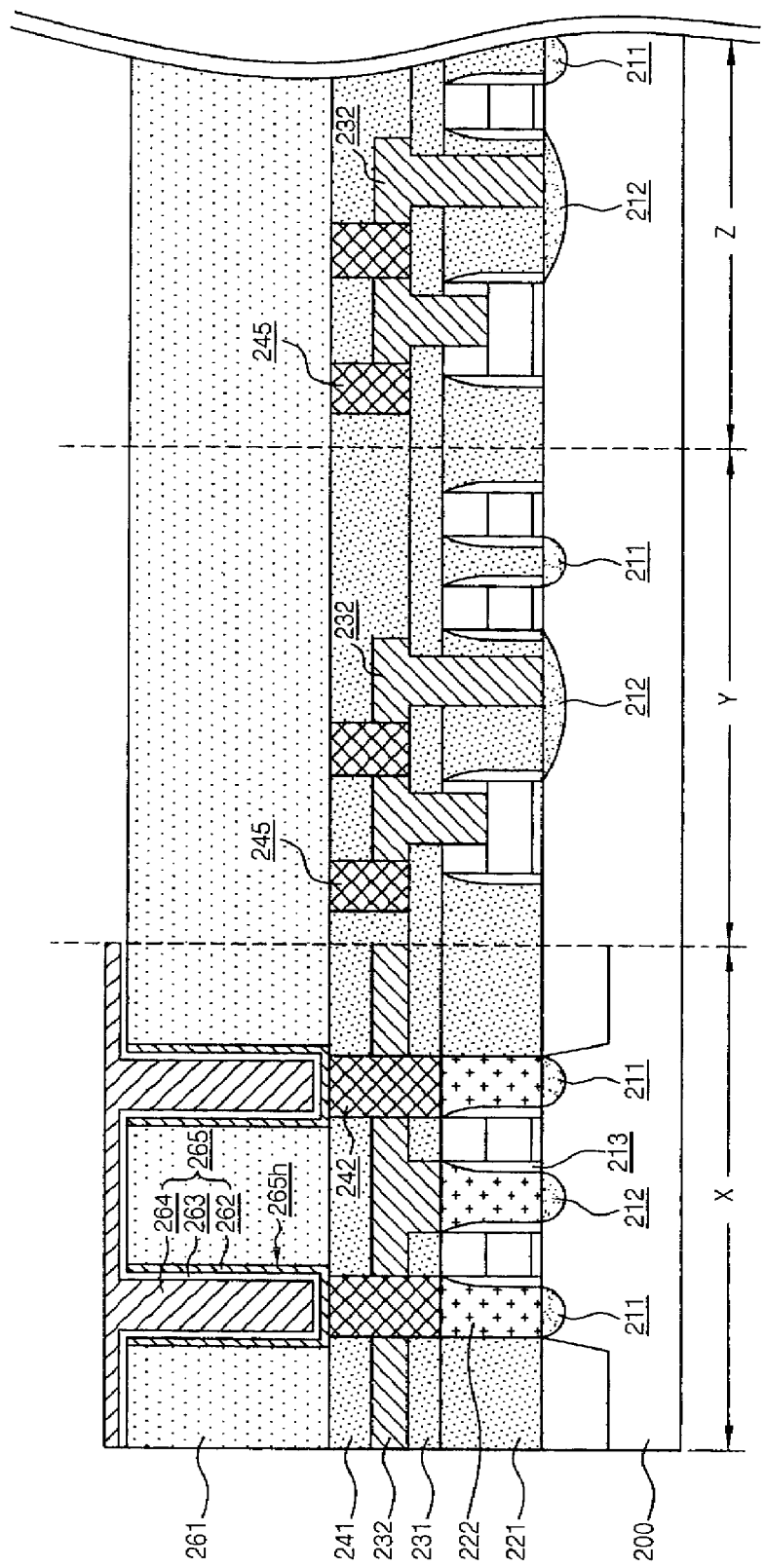

Referring to FIG. 2C, a mold insulation layer 261 is formed on the first interlayer dielectric 241 including the storage node contact plugs 242 and the blocking patterns 245. The mold insulation layer 261 is etched to define holes 265h that expose the storage node contact plugs 242 in the cell array region X. Capacitors 265 each including a storage node 262, a dielectric layer 263, and a plate node 264 are formed on the mold insulation layer 261, which includes the holes 265h in the cell array region X, to come into contact with the respective storage node contact plugs 242.

Figure 2D:
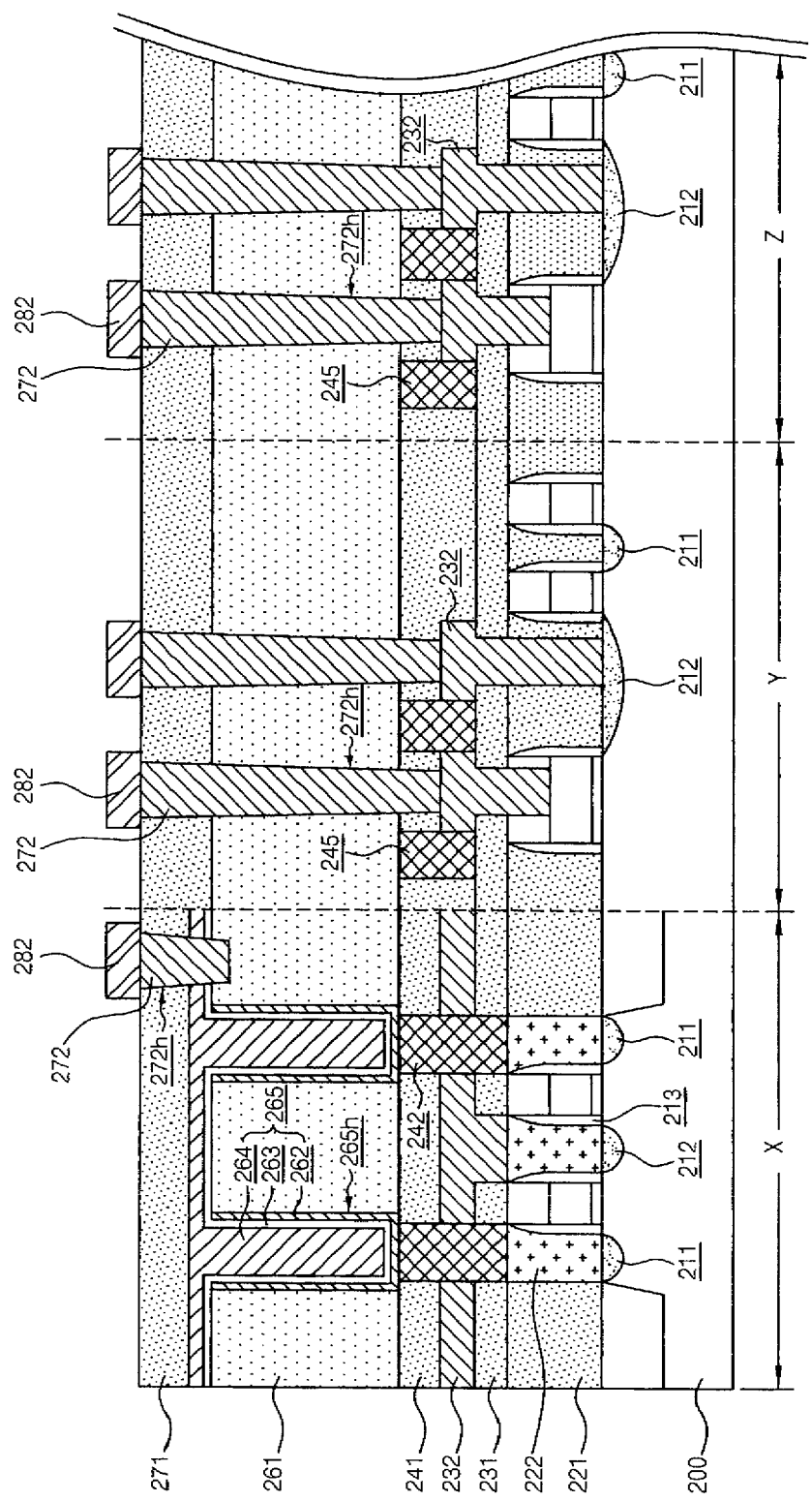

Referring to FIG. 2D, a second interlayer dielectric 271 is formed on the mold insulation layer 261 including the capacitors 265. The second interlayer dielectric 271 is then etched to define contact holes 272h for metal line contact plugs. Also, the contact holes 272h expose the plate node 264 of the capacitors 265 in the cell array region X and the bit lines 232 in the core region Y and the peripheral region Z. The contact hole 272h exposing the plate node 264 of the capacitors 265 in the cell array region X is formed to pass through the entire of the capacitor 265 by occurring over etch when forming the 272h for metal line contact plugs in the respective regions to come into contact with the bit lines 232 in the core region Y and the peripheral region Z. Metal contact plugs 272 are formed in the contact holes 272h for metal line contact plugs in the respective regions to come into contact with the capacitors 265 in the cell array region X and the bit lines 232 in the core region Y and the peripheral region Z. Metal lines 282 are formed on the metal contact plugs 272 in the respective regions to come into contact with the metal contact plugs 272.

Thereafter, while not shown in the drawings, by sequentially conducting a series of subsequent well-known processes, the manufacturing process of the semiconductor device according to the present embodiment is completed.

In the present embodiment, even if the decrease in the overlap margin between the metal contact plugs 272 and the bit lines 232 in the core region Y and the peripheral region Z causes the metal contact plugs 272 to be misaligned on the bit lines 232, the blocking patterns 245 will prevent the metal contact plugs 272 from coming into contact with the semiconductor substrate 200 or the gate 210.

Therefore, in the present invention, the metal contact plugs 272 formed in the core region Y and the peripheral region Z can come into contact with the bit lines 232 in a secure manner, and as such, the operation characteristics of the semiconductor device are improved.

Figure 3:
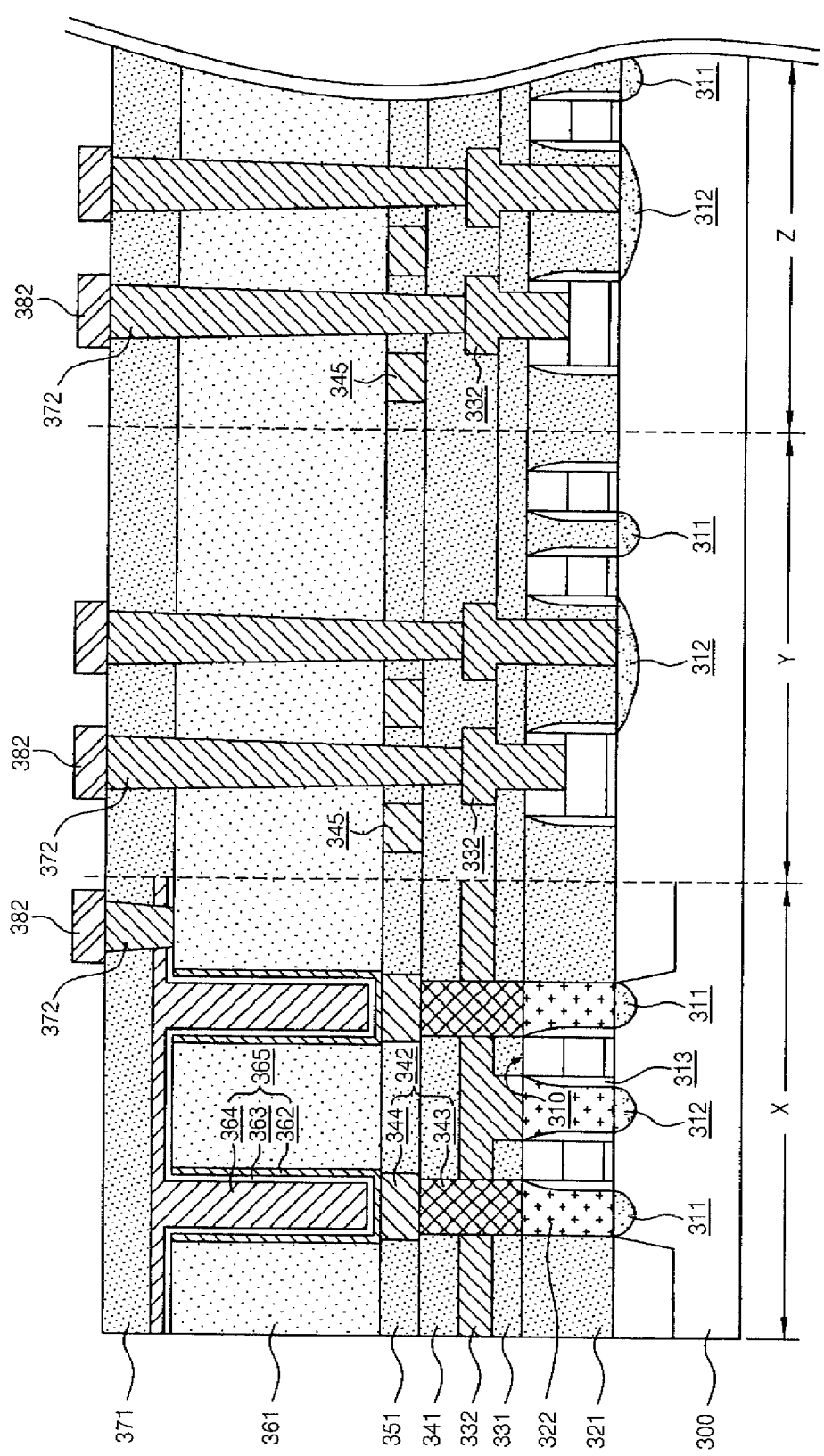
FIG. 3 is a cross-sectional view illustrating the processes of a method for manufacturing a semiconductor device in accordance with another embodiment of the present invention.

While the storage node contact plugs 242 described above are formed to have a single-layered structure, and the blocking patterns 245 are formed simultaneously with the storage node contact plugs 242 having the single-layered structure; as shown in FIG. 3, storage node contact plugs that are formed to have a stacked structure of a lower pattern and an upper pattern, and blocking patterns that are formed in the same layer as the upper patterns of the storage node contact plugs can be envisaged.

FIG. 3 is a cross-sectional view illustrating the processes of a method for manufacturing a semiconductor device in accordance with another embodiment of the present invention.

Referring to FIG. 3, storage node contact plugs 342, each of which is composed of a first storage node contact plug 343 as a lower pattern and a second storage node contact plug 344 as an upper pattern, are formed on bit lines 332 in the cell array region X of a semiconductor substrate 300. When forming the second storage node contact plugs 344 as the upper patterns of the storage node contact plugs 342, blocking patterns 345 are formed around the bit lines 332 formed in the core region Y and the peripheral region Z of the semiconductor substrate 300. When the storage node contact plugs 342 are formed to have the stacked structure of the lower pattern and the upper pattern, the overlap margin between the storage node contact plugs 342 and the storage nodes 362 of capacitors 365 in the cell array region X of the semiconductor substrate 300 can be increased. The blocking patterns 345 are formed to have a width in the range of 0.001~0.5 μm, and the sectional shape of a ring, a picture frame, a bar or a 'U' rotated clockwise by 90°.

The reference numeral 310 designates a gate, 311 a source area, 312 a drain area, 313 spacers, 321, 331 and 351 insulation layers, 322 landing plug contacts, 341 and 371 interlayer dielectrics, 361 a mold insulation layer, 363 a dielectric layer, 364 a plate node, 372 metal contact plugs, and 382 metal lines. These reference numbers were described in detail for FIGS. 2A through 2D.

As is apparent from the above description, in the present invention, when forming storage node contact plugs in the cell array region of a semiconductor substrate, blocking patterns are formed around the bit lines that are formed in the core region and the peripheral region of the semiconductor substrate. Therefore, even if the metal contact plugs are not aligned with the bit lines in the core region and the peripheral region of the semiconductor substrate, the blocking patterns stabilize the contact between the metal contact plugs and the bit lines. Accordingly, in the present invention, even with a decreased overlap margin between the bit lines and the metal contact, contact stabilization can be accomplished between the metal contact plugs and the bit lines, and thereby, the manufacturing yield of a semiconductor device can be increased.

Although specific embodiments of the present invention have been described for illustrative purposes, those skilled in the art will appreciate that various modifications, additions, and substitutions are possible without departing from the scope and spirit of the invention as disclosed in the accompanying claims.

What is claimed is:

1. A method for manufacturing a semiconductor device, comprising the steps of:
   forming bit lines in a cell array region, a core region, and a peripheral region of a semiconductor substrate;
   forming a first interlayer dielectric over the semiconductor substrate including the bit lines;
   forming storage node contact plugs in the first interlayer dielectric of the cell array region, and forming blocking patterns in the first interlayer dielectric around the bit lines of the core region and the peripheral region;
   forming a mold insulation layer on the first interlayer dielectric including the storage node contact plugs and the blocking patterns;
   forming capacitors in the mold insulation layer of the cell array region to come into contact with the storage node contact plugs;
   forming a second interlayer dielectric on the mold insulation layer including the capacitors;
   etching the second interlayer dielectric to define contact holes exposing the capacitors of the cell array region, and etching the second interlayer dielectric, the mold insulation layer, and the first dielectric layer to define contact holes exposing the bit lines of the core region and the peripheral region; and
   forming metal contact plugs in the contact holes exposing the capacitors and the contact holes exposing the bit lines.

2. The method according to claim 1, wherein the blocking patterns are formed to have the sectional shape of a ring, a picture frame, a bar, or a 'U' rotated clockwise by 90°.

3. The method according to claim 1, wherein the blocking patterns are formed to have a width of 0.001~0.5 μm.

4. A method for manufacturing a semiconductor device, comprising the steps of:
   forming bit lines in a cell array region, a core region, and a peripheral region of a semiconductor substrate;
   forming a first interlayer dielectric over the semiconductor substrate including the bit lines;
   forming first storage node contact plugs in the first interlayer dielectric of the cell array region;
   forming an insulation layer on the first interlayer dielectric including the first storage node contact plugs;
   forming second storage node contact plugs in the insulation layer to come into contact with the first storage node contact plugs, and forming blocking patterns in an area of the insulation layer corresponding to an area around the bit lines of the core region and the peripheral region;
   forming a mold insulation layer on the insulation layer including the second storage node contact plugs and the blocking patterns;
   forming capacitors in the mold insulation layer of the cell array region to come into contact with the second storage node contact plugs;
   forming a second interlayer dielectric on the mold insulation layer including the capacitors;
   etching the second interlayer dielectric to define contact holes exposing the capacitors of the cell array region, and etching the second interlayer dielectric, the mold insulation layer, the insulation layer, and the first interlayer dielectric to define contact holes exposing the bit lines of the core region and the peripheral region; and
   forming metal contact plugs in the contact holes exposing the capacitors and the contact holes exposing the bit lines.

5. The method according to claim 4, wherein the blocking patterns are formed to have the sectional shape of a ring, a picture frame, a bar, or a 'U' rotated clockwise by 90°.

6. The method according to claim 4, wherein the blocking patterns are formed to have a width of 0.001~0.5 μm.

* * * * *